(12) United States Patent
Li

(10) Patent No.: US 10,283,536 B2
(45) Date of Patent: May 7, 2019

(54) ARRAY SUBSTRATE, METHOD FOR MANUFACTURING THE SAME, DISPLAY DEVICE AND MASK PLATE

(71) Applicants: BOE TECHNOLOGY GROUP CO., LTD., Beijing (CN); ORDOS YUANSHENG OPTOELECTRONICS CO., LTD., Inner Mongolia Autonomous Region (CN)

(72) Inventor: Fuqiang Li, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia Autonomous Region (CN)

( * ) Notice: Subject to any disclaimer, the term of this patent is extended or adjusted under 35 U.S.C. 154(b) by 0 days.

(21) Appl. No.: 15/325,623

(22) PCT Filed: Jul. 22, 2016

(86) PCT No.: PCT/CN2016/090998
§ 371 (c)(1),
(2) Date: Jan. 11, 2017

(87) PCT Pub. No.: WO2017/059722
PCT Pub. Date: Apr. 13, 2017

(65) Prior Publication Data
US 2018/0204859 A1    Jul. 19, 2018

(30) Foreign Application Priority Data
Oct. 10, 2015    (CN) .......................... 2015 1 0653779

(51) Int. Cl.
*H01L 27/12*    (2006.01)
*H01L 21/265*    (2006.01)
(Continued)

(52) U.S. Cl.
CPC .... *H01L 27/1288* (2013.01); *H01L 21/02667* (2013.01); *H01L 21/265* (2013.01);
(Continued)

(58) Field of Classification Search
CPC ............ H01L 27/1288; H01L 27/1222; H01L 21/02667; H01L 21/265; H01L 21/26513;
(Continued)

(56) References Cited

U.S. PATENT DOCUMENTS 6,295,109 B1 * 9/2001 Kubo ................ G02F 1/133371
349/117
2003/0224577 A1    12/2003 Takahashi
(Continued)

FOREIGN PATENT DOCUMENTS

CN    1469429 A    1/2004
CN    1854872 A    11/2006
(Continued)

OTHER PUBLICATIONS

First Office Action for Chinese Application No. 201510653779.1, dated Oct. 23, 2017, 8 Pages.
(Continued)

*Primary Examiner* — Dzung Tran
(74) *Attorney, Agent, or Firm* — Brooks Kushman P.C.

(57) ABSTRACT

A method for manufacturing an array substrate includes (S1) forming a pattern including a gate electrode and a gate line, (S2) forming an insulating layer, (S3) forming a pattern including an active layer, where the region where the active layer is arranged includes a first region corresponding to the gate electrode and second regions arranged on both sides of
(Continued)

the first region, (S4) forming a mask pattern including a hollowed-out portion, a first portion and a second portion, wherein the second portion has a thickness smaller than the first portion, (S5) etching the insulating layer to form a via hole for exposing a portion of the gate line, and (S6) ashing a portion of the mask pattern corresponding to the second region to remove the portion of the mask pattern corresponding to the second region, and implanting ions into the active layer.

12 Claims, 3 Drawing Sheets

(51) Int. Cl.
    *H01L 21/266*     (2006.01)
    *H01L 21/02*     (2006.01)
    *H01L 29/66*     (2006.01)
    *H01L 29/786*     (2006.01)

(52) U.S. Cl.
CPC ...... *H01L 21/266* (2013.01); *H01L 21/26513* (2013.01); *H01L 27/124* (2013.01); *H01L 27/1222* (2013.01); *H01L 27/1274* (2013.01); *H01L 29/66765* (2013.01); *H01L 29/78621* (2013.01)

(58) Field of Classification Search
CPC .. H01L 21/266; H01L 27/12; H01L 29/66765
USPC .............................................. 257/72, 40, 79
See application file for complete search history.

(56) References Cited

U.S. PATENT DOCUMENTS

| | | | |
|---|---|---|---|
| 2005/0263768 A1* | 12/2005 | Ahn | G02F 1/136286 257/72 |
| 2007/0063645 A1* | 3/2007 | Yokoyama | G02F 1/133555 313/506 |
| 2007/0287235 A1 | 12/2007 | Lin | |
| 2009/0275155 A1* | 11/2009 | Lim | G02F 1/133555 438/29 |
| 2010/0193790 A1* | 8/2010 | Yeo | H01L 27/3248 257/59 |
| 2010/0285618 A1 | 11/2010 | Cheng et al. | |
| 2012/0069257 A1 | 3/2012 | Oh et al. | |
| 2012/0139045 A1* | 6/2012 | Kim | H01L 27/124 257/347 |
| 2014/0077214 A1 | 3/2014 | Deng | |
| 2016/0343745 A1 | 11/2016 | Xue et al. | |

FOREIGN PATENT DOCUMENTS

| | | |
|---|---|---|
| CN | 102522410 A | 6/2012 |
| CN | 102881688 A | 1/2013 |
| CN | 104300002 A | 1/2015 |
| CN | 104517896 A | 4/2015 |
| CN | 105355631 A | 2/2016 |
| KR | 20020053576 A | 7/2002 |

OTHER PUBLICATIONS

International Search Report and Written Opinion for Application No. PCT/CN2016/090998, dated Aug. 19, 2016, 10 Pages.

* cited by examiner

ARRAY SUBSTRATE, METHOD FOR MANUFACTURING THE SAME, DISPLAY DEVICE AND MASK PLATE

CROSS-REFERENCE TO RELATED APPLICATION APPLICATIONS

This application is the U.S. national phase of PCT Application No. PCT/CN2016/090998 filed on Jul. 22, 2016, which claims priority to Chinese Patent Application No. 201510653779.1 filed on Oct. 10, 2015, the disclosures of which are incorporated in their entirety by reference herein.

TECHNICAL FIELD

The present disclosure relates to the field of display technology, and in particular, to an array substrate, a method for manufacturing the array substrate, a display device including the array substrate and a mask plate.

BACKGROUND

Low-temperature polysilicon (LTPS) thin film transistor liquid crystal display is different from the traditional amorphous silicon thin film transistor liquid crystal display, and has a high electron mobility, which can effectively reduce the area of thin film transistor devices, improve an aperture ratio, and increase the brightness of the display while at the same time reducing the overall power consumption. In addition, since the LTPS thin film transistor liquid crystal display has a high electron mobility, a part of a driving circuit can be integrated on a glass substrate, and thus the cost of the driving circuit can be reduced, and the reliability of the liquid crystal display panel can be greatly improved, thereby greatly reducing the manufacturing cost of the panel. Therefore, the LTPS thin film transistor liquid crystal display has gradually become a research hotspot.

In the manufacturing process of the LTPS thin film transistor, an active layer, a gate electrode, via holes, a source electrode and a drain electrode are formed through the patterning processes, and the active layer needs to be doped with ions. The via holes includes a first via hole for connecting the source electrode and drain electrode to the active layer, and a second via hole for connecting a gate line to a signal line which can provide a scanning signal for the gate line. For a top gate type thin film transistor, the gate electrode can be used as a mask during doping ions, but it is still necessary to additionally form a light shielding layer through a single patterning process, to prevent the active layer from being influenced by light. Therefore, at least five times patterning processes are needed to be used during manufacturing the LTPS thin film transistor, resulting in a large number of mask plates being used. For a bottom gate type thin film transistor, the light shielding layer can be omitted, but the mask plate is needed to be used again during doping ions.

It can be seen that, the manufacturing process of the LTPS thin film transistor in the related art is complex, the number of the mask plate to be used is large, the frequency of using the mask plate is high, and the manufacturing cost is high.

SUMMARY

An objective of the present disclosure is to provide an array substrate, a method for manufacturing the array substrate, a display device and a mask plate, so as to reduce the use of the mask plate in the manufacturing process.

In one aspect, a method for manufacturing an array substrate is provided according to the present disclosure, which includes: S1 of forming a pattern including a gate electrode and a gate line; S2 of forming an insulating layer; S3 of forming a pattern including an active layer, where a region where the active layer is arranged includes a first region corresponding to the gate electrode and second regions arranged on both sides of the first region; S4 of forming a mask pattern, where the mask pattern includes a hollowed-out portion, a first portion and a second portion, the hollowed-out portion is used to expose a portion of the insulating layer corresponding to a portion of the gate line, the second portion corresponds to a portion of the second region, the first portion is a portion, other than the hollowed-out portion and the second portion, of the mask pattern, and the second portion has a thickness smaller than the first portion; S5 of etching the insulating layer to form a via hole for exposing a portion of the gate line; and S6 of ashing a portion of the mask pattern corresponding to the second region to remove the portion of the mask pattern corresponding to the second region, and implanting ions into the active layer.

Optionally, the second region includes an ion heavily doped region and an ion lightly doped region arranged between the ion heavily doped region and the first region, and S4 includes: S4a of forming a photoresist layer; and S4b of exposing and developing the photoresist layer using a mask plate. After the developing, photoresist corresponding to a portion of the gate line is completely dissolved, and a portion of photoresist corresponding to the ion heavily doped region is partly dissolved to form the second portion, and the remaining photoresist is completely reserved to form the first portion.

Optionally, S6 includes: S6a of ashing the developed photoresist layer for the first time to remove the second portion; S6b of implanting ions into the active layer for the first time to form a heavily doped source region and a heavily doped drain region; S6c of ashing the previously ashed photoresist layer for the second time to remove photoresist corresponding to the ion lightly doped region; and S6d of implanting ions into the active layer for the second time to form a lightly doped drain region.

Optionally, the photoresist is positive photoresist, the mask plate includes a transparent region, an opaque region and a semi-opaque region, the transparent region of the mask plate corresponds to the portion of the gate line, the semi-opaque region of the mask plate corresponds to an ion heavily doped region, and the opaque region is formed of a portion, other than the transparent region and the semi-opaque region, of the mask plate.

Optionally, after S6 of the manufacturing method further includes: S7 of forming a pattern including a source electrode, a drain electrode, and a conductive lead. The source electrode is lapped onto the heavily doped source region, the drain electrode is lapped onto the heavily doped drain region, and the conductive lead is connected to the gate line through the via hole.

Optionally, after S7, the method further includes: forming a passivation layer and forming a pixel electrode via hole in the passivation layer; forming a pixel electrode, where the pixel electrode is connected to the drain electrode through the pixel electrode via hole; and forming a common electrode.

Optionally, S3 includes: forming an amorphous silicon film layer; performing an annealing process on the amorphous silicon film layer to form a polysilicon layer; and patterning the polysilicon layer to form the active layer.

Accordingly, an array substrate is further provided according to the present disclosure, which includes a thin film transistor and a gate line connected to a gate electrode of the thin film transistor. An active layer of the thin film transistor includes a polysilicon region corresponding to a gate electrode, a heavily doped source region and a heavily doped drain region respectively arranged on both sides of the polysilicon region, and the active layer further includes lightly doped regions arranged between the polysilicon region and the heavily doped source region and between the polysilicon region and the heavily doped drain region. A source electrode of the thin film transistor is electrically connected to the heavily doped source region, and a drain electrode of the thin film transistor is electrically connected to the heavily doped drain region. The gate electrode of the thin film transistor is arranged below the active layer, and an insulating layer is arranged between the gate electrode and the active layer and between the gate line and the active layer. The array substrate further includes a conductive lead electrically connected to the gate line through a via hole penetrating the insulating layer.

Optionally, the source electrode is lapped onto the heavily doped source region, and the drain electrode is lapped onto the heavily doped drain region.

Optionally, the conductive lead is made of a same material as the source electrode and the drain electrode.

Accordingly, a display device is further provided according to the present disclosure, which includes the array substrate described above.

Accordingly, a mask plate is further provided according to the present disclosure, which is applied to manufacture the array substrate described above, and the mask plate includes a transparent region, an opaque region and a semi-opaque region. The transparent region corresponds to a portion of the gate line, the semi-opaque region corresponds to a heavily doped source region and a heavily doped drain region, and the opaque region is a portion, other than the transparent region and the semi-opaque region, of the mask plate.

In the present disclosure, since the gate electrode is formed prior to the formation of the active layer, the gate electrode can play the role of light shielding. Therefore, it is not necessary to form a light shielding layer. Besides, a mask pattern is formed before the formation of via holes. A mask plate can be used once in the formation of the mask pattern, only the mask pattern is needed to act as a mask during implanting ions, there is no need to use a mask plate separately again, thereby reducing the use of the mask plate, and reducing the process cost.

BRIEF DESCRIPTION OF THE DRAWINGS

The accompanying drawings are used to provide a further understanding of the present disclosure, as a part of the specification, serve to explain the present disclosure together with the following detailed description and are not to be construed as the limitation of the present disclosure. In the drawings.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

Unless otherwise defined, any technical or scientific terms used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than being limited to physical or mechanical connection. Such words as "on/above", "under/below", "left" and "right" are merely used to represent relative position relationship, and when an absolute position of an object is changed, the relative position relationship will be changed too.

Figure 1:
FIG. 1 is a schematic diagram after the formation of a gate and a gate line according to an embodiment of the present disclosure.
Figure 2:
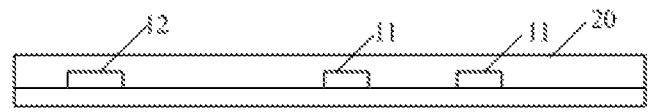
FIG. 2 is a schematic diagram after the formation of an insulating layer.
Figure 3:
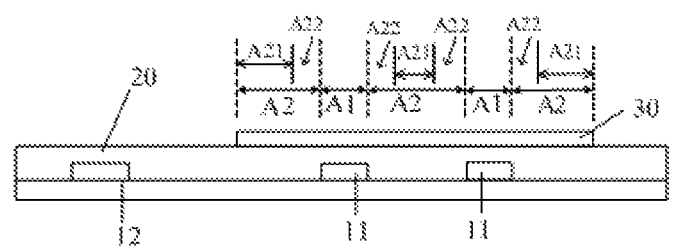
FIG. 3 is a schematic diagram after the formation of an active layer.

In one aspect, a method for manufacturing an array substrate is provided according to the present disclosure, which includes:

S1 of forming a pattern including a gate electrode 11 and a gate line 12, as shown in FIG. 1;

S2 of forming an insulating layer 20, as shown in FIG. 2;

S3 of forming a pattern including an active layer 30, as shown in FIG. 3, where the region where the active layer is arranged includes a first region A1 corresponding to the gate electrode and second regions A2 arranged on both sides of the first region A1;

S4 of forming a mask pattern, where the mask pattern includes a hollowed-out portion, a first portion and a second portion, the hollowed-out portion is used to expose a portion of the insulating layer corresponding to a portion of the gate line, the second portion corresponds to a portion of the second region, the first portion is a portion, other than the hollowed-out portion and the second portion, of the mask pattern, and the second portion has a thickness smaller than the first portion;

S5 of etching the insulating layer to form a via hole for exposing a portion of the gate line; and S6 of ashing a portion of the mask pattern corresponding to the second region to remove the portion of the mask pattern corresponding to the second region, and implanting ions into the active layer.

It should be understood that, during the displaying of the display panel including the array substrate, a scanning signal is provided for the gate line, the via hole formed in S5 is used to expose a portion of the gate line, and a conductive lead for providing the gate line with the scanning signal is formed in the subsequent process.

Generally, during the manufacturing process of the array substrate, in the case that the thin film transistor on the array substrate is a top gate type LTPS thin film transistor, in order to prevent the active layer from the influence of light, it is necessary to separately form a light shielding layer. In the case that a bottom gate type thin film transistor is manufactured, it is necessary to separately use a mask plate to implant ions into the active layer. However, in the present disclosure, since the gate electrode is formed before the formation of the active layer, the gate electrode can play the role of light shielding. Therefore, it is not necessary to form a light shielding layer. Besides, a mask pattern is formed before the formation of via holes. A mask plate can be used once in the formation of the mask pattern, only the mask pattern is needed to act as a mask during implanting ions, there is no need to use a mask plate separately again, thereby reducing the use of the mask plate, and reducing the process cost.

Optionally, S3 includes: forming an amorphous silicon film layer; performing an annealing process on the amorphous silicon film layer to form a polysilicon layer; and patterning the polysilicon layer to form the active layer.

Figure 4:
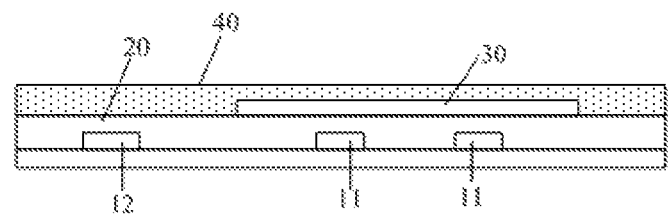
FIG. 4 is a schematic diagram after the formation of a photoresist layer.
Figure 5:
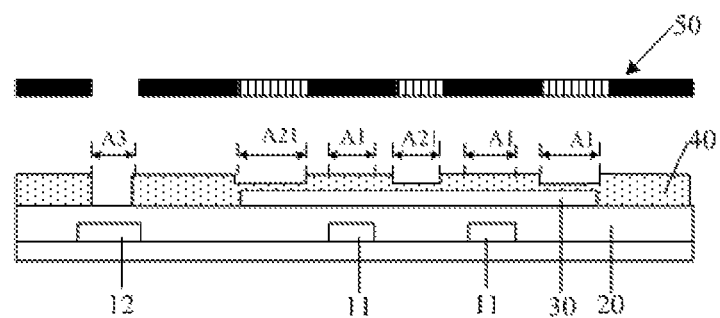
FIG. 5 is a schematic diagram after the development of a photoresist layer.

Specifically, as shown in FIG. 3, the second region A2 includes an ion heavily doped region A21 and an ion lightly doped region A22 arranged between the ion heavily doped region A21 and the first region A1. The ion heavily doped region A21 is a region which is needed to be doped heavily with ions in the subsequent process, and the ion lightly doped region A22 is a region which is needed to be doped lightly with ions in the subsequent process. Optionally, S4 includes: S4a of forming a photoresist layer 40, as shown in FIG. 4; and S4b of exposing and developing the photoresist layer 40 using a mask plate. After the developing, photoresist (that is, photoresist in a third region A3 in FIG. 5) corresponding to the portion of the gate line is completely dissolved, thereby forming the hollowed-out portion; and a portion of photoresist corresponding to the ion heavily doped region A21 is partly dissolved to form the second portion, and the remaining photoresist is completely reserved to form the first portion, as shown in FIG. 5.

Figure 6:
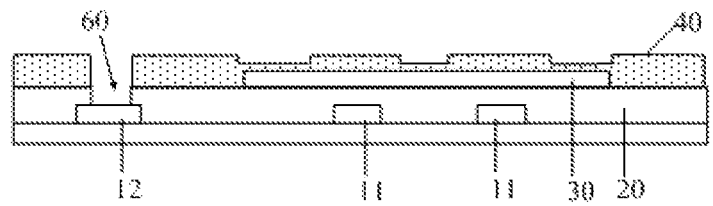
FIG. 6 is a schematic diagram of forming via holes.

When etching the insulating layer 20 in S5, a portion of the insulating layer corresponding to the hollowed-out portion may be etched to form a via hole 60, as shown in FIG. 6.

Figure 7:
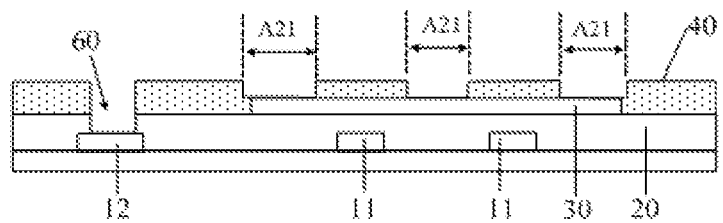
FIG. 7 is a schematic diagram after the ashing of a photoresist layer for the first time.
Figure 8:
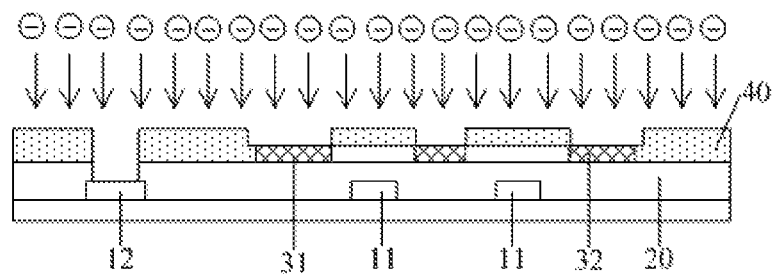
FIG. 8 is a schematic diagram of implanting ions for the first time.
Figure 9:
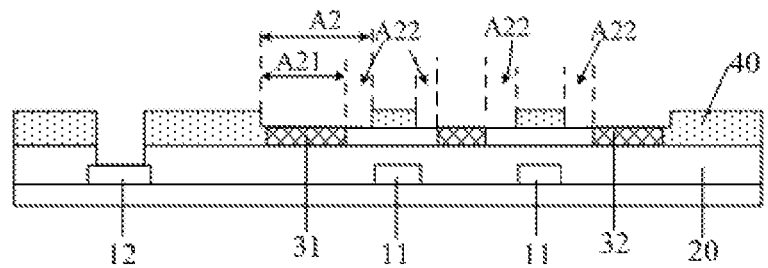
FIG. 9 is a schematic diagram after the ashing of a photoresist layer for the second time.
Figure 10:
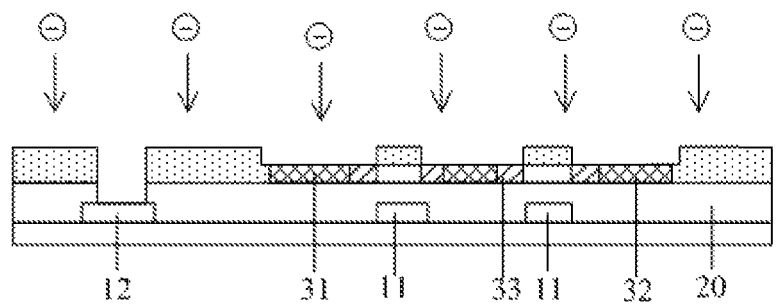
FIG. 10 is a schematic diagram of implanting ions for the second time.

Optionally, S6 includes: S6a of ashing the developed photoresist layer for the first time to remove the second portion (that is, a portion of the photoresist layer located in the ion heavily doped region A21), as shown in FIG. 7; S6b of implanting ions into the active layer for the first time, using the previously ashed photoresist layer as a mask plate, to form a heavily doped source region 31 and a heavily doped drain region 32, as shown in FIG. 8; S6c of ashing the previously ashed photoresist layer for the second time to remove photoresist corresponding to the ion lightly doped region A22, as shown in FIG. 9; and S6d of implanting ions into the active layer for the second time, using the secondly ashed photoresist layer as a mask plate, to form a lightly doped region 33, as shown in FIG. 10. After the heavily doped source region 31, the heavily doped drain region 32 and the lightly doped region 33 are formed, the remaining photoresist is stripped off Herein, the first ion implantation is a heavily doped process in which a trivalent or pentavalent element is doped to improve the conductivity of semiconductors; while the second ion implantation is a lightly doped process, and the lightly doped region is equivalent to a large-resistance resistor connected in serial to reduce a drain current. The types of ions in the two implanting processes may be the same, but with different concentrations. The concentration of the ions doped during the heavily doped process is larger than the concentration of the ions doped during the lightly doped process. In a case that the formed thin film transistor is an N type transistor, phosphorus atoms or antimony atoms may be implanted into the active layer; and in a case that the formed thin film transistor is a P type transistor, Boron atoms or Indium atoms may be implanted into the active layer.

The process of ashing the photoresist layer includes introducing oxygen-containing gas, carrying out an oxidizing reaction with the photoresist. Thus, not only the thickness of the ashed photoresist layer is reduced, but also the width of the ashed photoresist layer is narrowed.

Specifically, the photoresist is positive photoresist, the mask plate 50 may be a halftone mask plate or a gray-tone mask plate, as shown in FIG. 5, which includes a transparent region (an opening portion on the mask plate 50 in FIG. 5), an opaque region (a black portion on the mask plate 50 in FIG. 5) and a semi-opaque region (a portion noted by profile lines on the mask plate 50 in FIG. 5). The transparent region of the mask plate 50 corresponds to a portion of the gate line 12, the semi-opaque region of the mask plate 50 corresponds to an ion heavily doped region A21, and the opaque region is a portion, other than the transparent region and the semi-opaque region, of the mask plate 50. Therefore, the positive photoresist corresponding to the transparent region can be completely dissolved in developing solution after being irradiated by light, and the positive photoresist corresponding to the semi-opaque region can be partly dissolved in developing solution after being irradiated by light, and the positive photoresist corresponding to the opaque region is not dissolved in developer. Of course, the photoresist may also be a negative photoresist. In the case that the photoresist is the negative photoresist, it is only necessary to exchange the positions of the opaque region and the transparent region of the mask plate.

Figure 11:
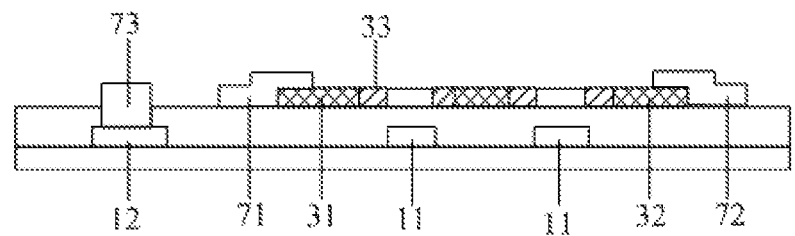
FIG. 11 is a schematic diagram of forming a conductive lead, a source electrode, and a drain electrode.

Optionally, the method further includes step S7, which is performed after S6, of forming a pattern including a source electrode 71, a drain electrode 72, and a conductive lead 73. The source electrode 71 is lapped onto the heavily doped source region 31, the drain electrode 72 is lapped onto the heavily doped drain region 32, and the conductive lead 73 is connected to the gate line 12 through the via hole to provide the gate line 12 with a scanning signal, as shown in FIG. 11.

As can be seen that, when the thin film transistor is formed with the above process of the present disclosure, the gate line 12 and the gate electrode 11 are formed by a first patterning process, the active layer 30 is formed by a second patterning process, a mask pattern is formed by a third patterning process, where the mask pattern is used as a mask for etching via holes while the mask pattern is also used as a mask for ion implantation; and the conductive pattern 73, the source electrode 71 and the drain electrode 72 is formed by a fourth patterning process. Therefore, during the manufacture of the thin film transistor, four mask plates are needed, as compared with the related art, the use of the mask plate is reduced and the process cost is reduced.

Of course, after S7, the method according to the present disclosure may further include: forming a passivation layer and forming a pixel electrode via hole in the passivation layer; forming a pixel electrode, where the pixel electrode is connected to the drain electrode through the pixel electrode via hole; and forming a common electrode.

As shown in FIG. 1 to FIG. 11, the thin film transistor is a double gate type thin film transistor. That is, the thin film transistor has two gates 11. There are two first regions included in the region where the active layer is arranged. during the ion implantation for the first time, as shown in FIG. 7, two ion heavily doped regions at both sides of each of the first regions are doped heavily; during the ion implantation for the second time, two ion lightly doped regions at both sides of each of the first regions are doped lightly, thus four lightly doped regions 33 are formed in the active layer.

Figure 12:
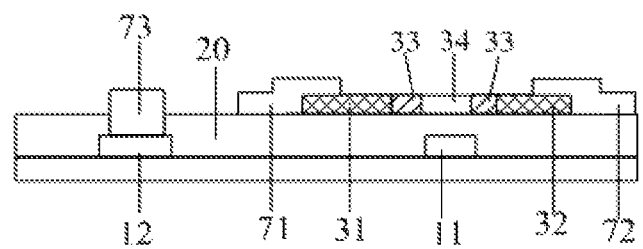
FIG. 12 is a schematic diagram of a part of an array substrate according to an embodiment of the present disclosure.

The thin film transistor may also be a single gate type thin film transistor, as shown in FIG. 12. In this case, a heavily doped source region 31 and a heavily doped drain region 32 are formed in the active layer after the first ion implantation, and a conductive region is arranged between the heavily doped source region 31 and the heavily doped drain region 32. And after the second ion implantation, a polysilicon region 34 and a lightly doped region 33 arranged on both sides of the polysilicon region are formed in the conductive region.

In a second aspect, an array substrate is further provided according to the present disclosure, which can be manufactured with the method described above.

Specifically, the array substrate includes a thin film transistor; and a gate line connected to a gate electrode of the thin film transistor. As shown in FIG. 11, an active layer of the thin film transistor includes a polysilicon region 34 corresponding to a gate electrode; and a heavily doped source region 31 and a heavily doped drain region 32 respectively arranged on both sides of the polysilicon region 34. The active layer further includes lightly doped regions 33 arranged between the polysilicon region 34 and the heavily doped source region 31 and between the polysilicon region 34 and the heavily doped drain region 32. A source electrode 71 of the thin film transistor is electrically connected to the heavily doped source region 31, and a drain electrode 72 of the thin film transistor is electrically connected to the heavily doped drain region 32. The gate electrode 11 of the thin film transistor is arranged below the active layer, an insulating layer 20 is arranged between the gate electrode 11 and the active layer and between the gate line 12 and the active layer. The array substrate further includes a conductive lead 73 electrically connected to the gate line 12 through a via hole penetrating the insulating layer 20.

Optionally, the source electrode 71 is lapped onto the heavily doped source region 31, and the drain electrode 72 is lapped onto the heavily doped drain region 32.

Since the gate electrode of the thin film transistor is disposed below the active layer, the gate electrode can play the role of light shielding. Therefore, it is unnecessary to form a light shielding layer. Besides, the source and drain electrodes are directly connected to the active layer. Unlike in the related art, it is unnecessary to form an insulating layer, a source via hole and a drain via hole above the active layer, so that the source electrode is connected to the active layer through the source via hole, and the drain electrode is connected to the active layer through the drain via hole, thereby simplifying the structure of the thin film transistor.

Specifically, the conductive lead 73 is made of a same material as the source electrode 71 and the drain electrode 72; and the conductive lead 73, the source electrode 71, and the drain electrode 72 may be formed simultaneously in fabrication.

In third aspect, a display device is further provided according to the present disclosure, which includes the array substrate described above.

In fourth aspect, a mask plate is further provided according to the present disclosure, which is applied to manufacture the array substrate described above. The mask plate includes a transparent region, an opaque region and a semi-opaque region. The transparent region corresponds to a portion of the gate line, the semi-opaque region corresponds to a heavily doped source region and a heavily doped drain region, and the opaque region is a portion, other than the transparent region and the semi-opaque region, of the mask plate.

The mask plate may be used to form the mask pattern in the method for manufacturing the array substrate described above. As shown in FIG. 5, a photoresist layer 40 is formed on the substrate on which the active layer is formed. The photoresist layer 40 is exposed using the mask plate, and then the exposed photoresist is developed. After the developing, photoresist corresponding to a portion of the gate line is removed, a portion of photoresist corresponding to regions where the heavily doped source region and the heavily doped drain region are to be formed (that is, the above-mentioned ion heavily doped regions A21) is partly removed, and the remaining photoresist is completely reserved.

It can be understood that the above-described embodiments are only exemplary embodiments to illustrate the principle of the present disclosure, but the present disclosure is not limited thereto. For those skilled in the art, various changes and modifications may be made to the present disclosure without departing from the spirit and scope of the present disclosure, and these changes and modifications fall into the protective scope of the present disclosure.

What is claimed is:
1. A method for manufacturing an array substrate, comprising:
(S1) forming a pattern comprising a gate electrode and a gate line;
(S2) forming an insulating layer;
(S3) forming a pattern comprising an active layer, wherein a region where the active layer is arranged comprises a first region completely overlapping the gate electrode and second regions arranged on both sides of the first region;
(S4) forming a mask pattern, wherein the mask pattern comprises a hollowed-out portion, a first portion and a second portion, the hollowed-out portion is used to expose a portion of the insulating layer completely overlapping a portion of the gate line, the second portion completely overlaps a portion of the second region, the first portion is a portion of the mask pattern other than the hollowed-out portion and the second portion, and the second portion has a thickness smaller than the first portion;
(S5) etching the insulating layer to form a via hole for exposing a portion of the gate line; and
(S6) ashing a portion of the mask pattern completely overlapping the second region to remove the portion of the mask pattern completely overlapping the second region, and implanting ions into the active layer.

2. The method according to claim 1, wherein the second region comprises an ion heavily doped region and an ion lightly doped region arranged between the ion heavily doped region and the first region, and the step of forming a mask pattern (S4) comprises:
(S4a) forming a photoresist layer; and
(S4b) exposing and developing the photoresist layer using a mask plate, wherein after the developing, photoresist completely overlapping a portion of the gate line is completely dissolved, and a portion of photoresist completely overlapping the ion heavily doped region is partly dissolved to form the second portion, and the remaining photoresist is completely reserved to form the first portion.

3. The method according to claim 2, wherein the step of ashing a portion of the mask pattern (S6) comprises:
(S6a) ashing the developed photoresist layer for the first time to remove the second portion;
(S6b) implanting ions into the active layer for the first time to form a heavily doped source region and a heavily doped drain region;
(S6c) ashing the previously ashed photoresist layer for the second time to remove photoresist completely overlapping the ion lightly doped region; and
(S6d) implanting ions into the active layer for the second time to form a lightly doped drain region.

4. The method according to claim 2, wherein the photoresist is positive photoresist, the mask plate comprises a transparent region, an opaque region and a semi-opaque region, the transparent region of the mask plate completely overlaps the portion of the gate line, the semi-opaque region of the mask plate completely overlaps an ion heavily doped region, and the opaque region is a portion, other than the transparent region and the semi-opaque region, of the mask plate.

5. The method according to claim 3, wherein after the step of ashing a portion of the mast pattern (S6), the method further comprises:
(S7) forming a pattern comprising a source electrode, a drain electrode, and a conductive lead, wherein the source electrode is lapped onto the heavily doped source region, the drain electrode is lapped onto the heavily doped drain region, and the conductive lead is connected to the gate line through the via hole.

6. The method according to claim 5, wherein after the step of forming a pattern comprising a source electrode, a drain electrode, and a conductive lead (S7), the method further comprises:
forming a passivation layer and forming a pixel electrode via hole in the passivation layer;
forming a pixel electrode, wherein the pixel electrode is connected to the drain electrode through the pixel electrode via hole; and
forming a common electrode.

7. The method according to claim 1, wherein the step of forming a pattern comprising active layer (S3) comprises:
forming an amorphous silicon film layer;
performing an annealing process on the amorphous silicon film layer to form a polysilicon layer; and
patterning the polysilicon layer to form the active layer.

8. The method according to claim 4, wherein after the step of ashing a portion of the mast pattern (S6), the method further comprises:
(S7) forming a pattern comprising a source electrode, a drain electrode, and a conductive lead, wherein the source electrode is lapped onto the heavily doped source region, the drain electrode is lapped onto the heavily doped drain region, and the conductive lead is connected to the gate line through the via hole.

9. The method according to claim 8, wherein after the step of forming a pattern comprising a source electrode, a drain electrode, and a conductive lead (S7), the method further comprises:
forming a passivation layer and forming a pixel electrode via hole in the passivation layer;
forming a pixel electrode, wherein the pixel electrode is connected to the drain electrode through the pixel electrode via hole; and
forming a common electrode.

10. The method according to claim 2, wherein the step of forming a pattern comprising an active layer (S3) comprises:
forming an amorphous silicon film layer;
performing an annealing process on the amorphous silicon film layer to form a polysilicon layer; and
patterning the polysilicon layer to form the active layer.

11. The method according to claim 3, wherein the step of forming a pattern comprises an active layer (S3) comprises:
forming an amorphous silicon film layer;
performing an annealing process on the amorphous silicon film layer to form a polysilicon layer; and
patterning the polysilicon layer to form the active layer.

12. The method according to claim 4, wherein the step of forming a pattern comprising an active layer (S3) comprises:
forming an amorphous silicon film layer;
performing an annealing process on the amorphous silicon film layer to form a polysilicon layer; and
patterning the polysilicon layer to form the active layer.

* * * * *